United States Patent [19]
Ohno

[11] Patent Number: 5,923,062
[45] Date of Patent: *Jul. 13, 1999

[54] SEMICONDUCTOR DEVICE INCORPORATING CAPACITORS

[75] Inventor: Yoshikazu Ohno, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/467,650

[22] Filed: Jun. 6, 1995

[30] Foreign Application Priority Data

Oct. 11, 1994 [JP] Japan .................................. 6-245616

[51] Int. Cl.$^6$ .......................... H01L 27/08; H01L 29/76; H01L 29/94; H01L 31/119
[52] U.S. Cl. ........................ 257/298; 257/296; 257/306; 257/310
[58] Field of Search .................... 257/298, 296, 257/306, 310; 361/321.4; 365/149

[56] References Cited

U.S. PATENT DOCUMENTS

| | | | |
|---|---|---|---|
| 5,111,355 | 5/1992 | Anand et al. | 257/296 |
| 5,335,138 | 8/1994 | Sandhu et al. | |
| 5,406,103 | 4/1995 | Ogawa . | |
| 5,486,713 | 1/1996 | Koyama | 257/298 |
| 5,559,666 | 9/1996 | Figura et al. | |
| 5,568,352 | 10/1996 | Hwang . | |

FOREIGN PATENT DOCUMENTS

| | | |
|---|---|---|
| 3256358 | 11/1991 | Japan . |
| 4-14862 | 1/1992 | Japan . |
| 46865 | 1/1992 | Japan . |
| 456160 | 2/1992 | Japan . |

OTHER PUBLICATIONS

Kuniaki Koyama et al, A Stacked Capacitor with (Ba$_x$Sr$_{1-x}$)TiO$_3$ for 256M DRAM, IEEE 1991, pp. 823–826.

*Primary Examiner*—Stephen D. Meier
*Attorney, Agent, or Firm*—McDermott, Will & Emery

[57] ABSTRACT

A semiconductor device has a memory cell array including MOS transistors and capacitors. Each capacitor include a first capacitor electrode, capacitor dielectric film, and a second capacitor electrode which confronts the first capacitor electrode with the dielectric film interposed therebetween. The first capacitor electrode includes a first-layer electrode having an upper and lower surfaces and a circumferential side surface, and a second-layer electrode which is connected electrically to the lower surface of the first-layer electrode and has a circumferential side surface located inner than the side surface of the first-layer electrode. The capacitor dielectric film is in contact with the upper surface and side surface of the first-layer electrode and spaced out from the side surface of the second-layer electrode. This electrode arrangement suppresses the emergence of a leakage current at the side surface of the second-layer electrode.

18 Claims, 7 Drawing Sheets

SEMICONDUCTOR DEVICE INCORPORATING CAPACITORS

CROSS-REFERENCE TO RELATED APPLICATION

This application is related to copending application Ser. No. 08/264,117, filed Jun. 22, 1994, commonly assigned with the present invention.

BACKGROUND OF THE INVENTION

1. Field of the Invention

The present invention generally relates to a semiconductor device, and more particularly to a semiconductor device incorporating capacitors based on a high-dielectric film material.

2. Description of the Related Art

Workstations and personal computers have their main memories based on DRAM (Dynamic Random Access Memory) chips. A DRAM chip consists of a plurality of (e.g., 64 Mega bits) memory cells, each storing 1-bit binary data. Each memory cell consists of a MOS (Metal Oxide Semiconductor) transistor and a capacitor. The memory cell stores 1-bit data in terms of whether or not the capacitor is charged. The conduction of charges through the MOS transistor between the capacitor and the bit line, which has been precharged to the precharge voltage and thereafter brought to the floating state, causes the bit line voltage to vary. For reading out 1-bit data from the memory cell, a voltage difference between the bit line voltage and the precharge voltage is amplified by a sense amplifier in connection with the bit line.

A voltage difference emerging on the bit line at reading out data from the memory cell must be competent against the noise on the bit line and to meet the sensitivity of sense amplifier. In other words, the capacitor of memory cell must have a capacitance large enough to cause a certain voltage difference to arise at data reading. However, due to the ever increasing scale of integration and capacity of DRAM chips, the capacitor electrodes become smaller. In dealing with this trend, there is practiced a large scale production of DRAM chips employing memory cells of stack type or trench type in which the capacitor electrodes have a sufficient area by extending vertically in the semiconductor substrate. At the same time, research and development are under way for forming capacitors of memory cells with a dielectric film material having a large dielectric constant so that a large capacitance per unit area is accomplished.

FIG. 5 shows the cross section of a conventional DRAM chip having capacitors formed of dielectric film material with a large dielectric constant. In the figure, on one major surface of a p-type semiconductor substrate 1, there are formed n-type MOS transistors 2 each having a source/drain region 2a, another source/drain region 2b and a gate electrode 2e. The gate electrode 2e is formed to confront a channel region 2c between the two source/drain regions 2a and 2b with a gate insulation film 2d interposed therebetween. Gate electrodes 2e are part of word lines running in parallel to one another. A device separation region 3 is formed of an oxide film. Similarly, part of word lines 4 serve as gate electrodes of other MOS transistors (not shown). An oxide film 5 is formed to cover the gate electrodes 2e and word lines 4, and it has the formation of a contact hole 6 above the other source/drain region 2b.

A buried bit line 7 of polycrystalline silicon (poly-Si) is formed on the oxide film 5, and it is connected to the other source/drain region 2b through the contact hole 6. An insulating layer 8 is formed to cover the buried bit line 7. An inter-layer insulation film 9 of BPSG (Boro-Phospho Silicate Glass) film having a planar upper surface is formed on the entire substrate 1. A contact hole 10 is formed to run through the inter-layer insulation film 9 and reach the surface of the one source/drain region 2a. A plug 11 of Poly-Si is formed to fill the interior of the contact hole 10 and to be connected to the one source/drain region 2a.

One capacitor electrode 12 of platinum (Pt) is formed on the inter-layer insulation film 9, and it is connected to the one source/drain region 2a through the plug 11 in the contact hole 10. A dielectric film 13 of high-dielectric material $SrTiO_3$ for making a capacitor is formed by being in contact with the upper and side surfaces of the one capacitor electrode 12. Another capacitor electrode 14 of platinum (Pt) is formed to confront the one capacitor electrode 12 by being interposed with the capacitor dielectric film 13. Accordingly, the electrodes 12 and 14 and dielectric film 13 in unison constitute a capacitor. The one capacitor electrode 12 is made from platinum so that the dielectric film 13 has a normal crystal structure of high-dielectric material $SrTiO_3$.

An inter-layer insulation film 15 having a planar upper surface is formed on the entire surface of the other capacitor electrode 14. Wiring strips 16 of aluminum (Al) are formed on the inter-layer insulation film 15. Another inter-layer insulation film 17 is formed to cover the entire surface of the wiring strips 16. Other wiring strips 18 of aluminum are formed on the inter-layer insulation film 17 to extend perpendicularly to the wiring strips 16.

In the foregoing conventional DRAM chip incorporating capacitors formed of high-dielectric films, the one capacitor electrode 12 of platinum is in direct contact with the inter-layer insulation film 9 of BPSG and the plug 11 for connecting the electrode 12 to the one source/drain region 2a. Therefore, constituent atoms, other than platinum, of the inter-layer insulation film 9 and plug 11 (e.g., silicon atoms of the plug 11) diffuse into the one capacitor electrode 12 of platinum. This gives rise to such a problem that the capacitor dielectric film 13 cannot have a normal crystal structure.

In order to solve this problem, there has been proposed a DRAM chip structure as shown in FIG. 6. This DRAM chip is different from the one shown in FIG. 5 in that one capacitor electrode 12 consists of a high-layer electrode 12a of platinum and a low-layer electrode 12b which is formed between the high-layer electrode 12a and the inter-layer insulation film 9 and plug 11 and adapted to serve as a barrier.

However, this improved DRAM chip shown in FIG. 6 has its composition of crystal structure varied at the portion of the capacitor dielectric film 13 in contact with the side surface of the low-layer electrode 12b, resulting in deteriorated insulation characteristics of that portion. This gives rise to the emergence of a leakage current flowing between the side surface of the low-layer electrode 12b and the other capacitor electrode 14, resulting in deteriorated data holding characteristics of the memory cell.

SUMMARY OF THE INVENTION

An object of the present invention is to provide a semiconductor device incorporating capacitors, with the intention being suppressing the emergence of a leakage current at the portion of capacitor dielectric film confronting the side surface of the low-layer electrode of one capacitor electrode even in the event of the variation of crystal structure of that portion.

Another object of the present invention is to provide a semiconductor device incorporating capacitors formed of a high-dielectric film material, with the intention being suppressing the leakage current of the capacitors.

Still another object of the present invention is to provide a semiconductor device including memory cells with superior data holding characteristics.

The semiconductor device incorporating capacitors according to one aspect of this invention comprises a first capacitor electrode, a capacitor dielectric film and a second capacitor electrode which is formed to confront the first capacitor electrode with the capacitor dielectric film interposed therebetween. The first capacitor electrode includes a first-layer electrode which has an upper and lower surfaces and a circumferential side surface, and a second-layer electrode which is formed by being connected electrically to the first-layer electrode at the lower surface thereof and has a circumferential side surface located inner than the side surface of the first-layer electrode. The capacitor dielectric film is formed to confront the side surface of the second-layer electrode by being in contact with the upper surface and side surface of the first-layer electrode and by being spaced out from the side surface of the second-layer electrode.

According to a preferable embodiment, the capacitor dielectric film includes a material that has a polycrystal structure by being formed in contact with the first-layer electrode and has a structure different from the polycrystal structure by being formed in contact with the second-layer electrode. The capacitor dielectric film is formed to confront the side surface of the second-layer electrode with an insulator interposed therebetween.

According to a more preferable embodiment, the capacitor dielectric film includes at least one material selected from a group of $SrTiO_3$, $BaTiO_3$, $(Ba,Sr)TiO_3$, PZT and PLZT. The first-layer electrode includes at least one material selected from a group of Pt, Ta, Ru and metallic compounds thereof. The second-layer electrode includes at least one material selected from a group of TiN, Ta, Ti and $RuO_2$. The second capacitor electrode includes at least one material selected from a group of Pt, Ta, Ru and metallic compounds thereof.

The semiconductor device incorporating capacitors according to another aspect of this invention comprises a first capacitor electrode, a capacitor dielectric film including at least one material selected from a group of $SrTiO_3$, $BaTiO_3$, $(Ba,Sr)TiO_3$, PZT and PLZT, and a second capacitor electrode which is formed to confront the first capacitor electrode with the capacitor dielectric film interposed therebetween. The first capacitor electrode includes a first-layer electrode having an upper and lower surfaces and a circumferential side surface and including at least one material selected from a group of Pt, Ta, Ru and metallic compounds thereof, and a second-layer electrode which is formed by being connected electrically to the first-layer electrode at the lower surface thereof, has a side surface located inner than the side surface of the first-layer electrode and includes at least one material selected from a group of TiN, Ta, Ti and $RuO_2$. The capacitor dielectric film is formed to confront side surface of the second-layer electrode by being in contact with the upper surface and side surface of the first-layer electrode and by being spaced out from the second-layer electrode.

According to a preferable embodiment, the second capacitor electrode includes at least one material selected from a group of Pt, Ta, Ru and metallic compounds thereof, and the capacitor dielectric film is formed to confront the side surface of the second-layer electrode with an insulator interposed therebetween.

The semiconductor device according to still another aspect of this invention comprises a semiconductor substrate, field effect transistors, an inter-layer insulation film, and capacitors. The semiconductor substrate has a major surface and includes a region of a first conductivity type. The field effect transistors are formed on the major surface of the substrate.

Each field effect transistor has a first impurity region of a second conductivity type formed on the major surface of the substrate, a second impurity region of the second conductivity type formed on the major surface of the substrate by being spaced out from the first impurity region, and a gate electrode formed to confront a region between the first and second impurity regions on the major surface of the substrate with a gate insulation film interposed therebetween.

An inter-layer insulation film is formed on the major surface of the substrate, and it has a contact hole which reaches the surface of the first impurity region. Capacitors are formed on the inter-layer insulation film. Pairs of field effect transistor and capacitor constitute memory cells.

Each capacitor has a first capacitor electrode, a capacitor dielectric film, and a second capacitor electrode which is formed to confront the first capacitor electrode with the capacitor dielectric film interposed therebetween. The first capacitor electrode includes a first-layer electrode having an upper and lower surfaces and a circumferential side surface, and a second-layer electrode which is formed by being connected electrically to the first-layer electrode at the lower surface thereof and has a circumferential side surface located inner than the side surface of the first-layer electrode. The capacitor dielectric film is formed to confront the side surface of the second-layer electrode by being in contact with the upper surface and side surface of the first-layer electrode and by being spaced out from the second-layer electrode.

In the inventive semiconductor device, the second-layer electrode of the first capacitor electrode has its side surface located inner than the side surface of the first-layer electrode, and the capacitor dielectric film has its portion confronting the side surface of the second-layer electrode formed by being spaced out from the side surface of the second-layer electrode. Consequently, even if the crystal structure of the capacitor dielectric film portion confronting the side surface of the second-layer electrode varies, resulting in deteriorated insulation characteristics, it is still possible to suppress the leakage current flowing between the side surface of the second-layer electrode and the second capacitor electrode through that portion.

Based on the suppression of the leakage current of the capacitor, charges stored in it can be held for a long time, and consequently a semiconductor device including memory cells with superior data holding characteristics is accomplished.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

The structure of a DRAM chip based on an embodiment of this invention will be explained with reference to FIG. 1, FIG. 2 and FIG. 3.

Figure 1:
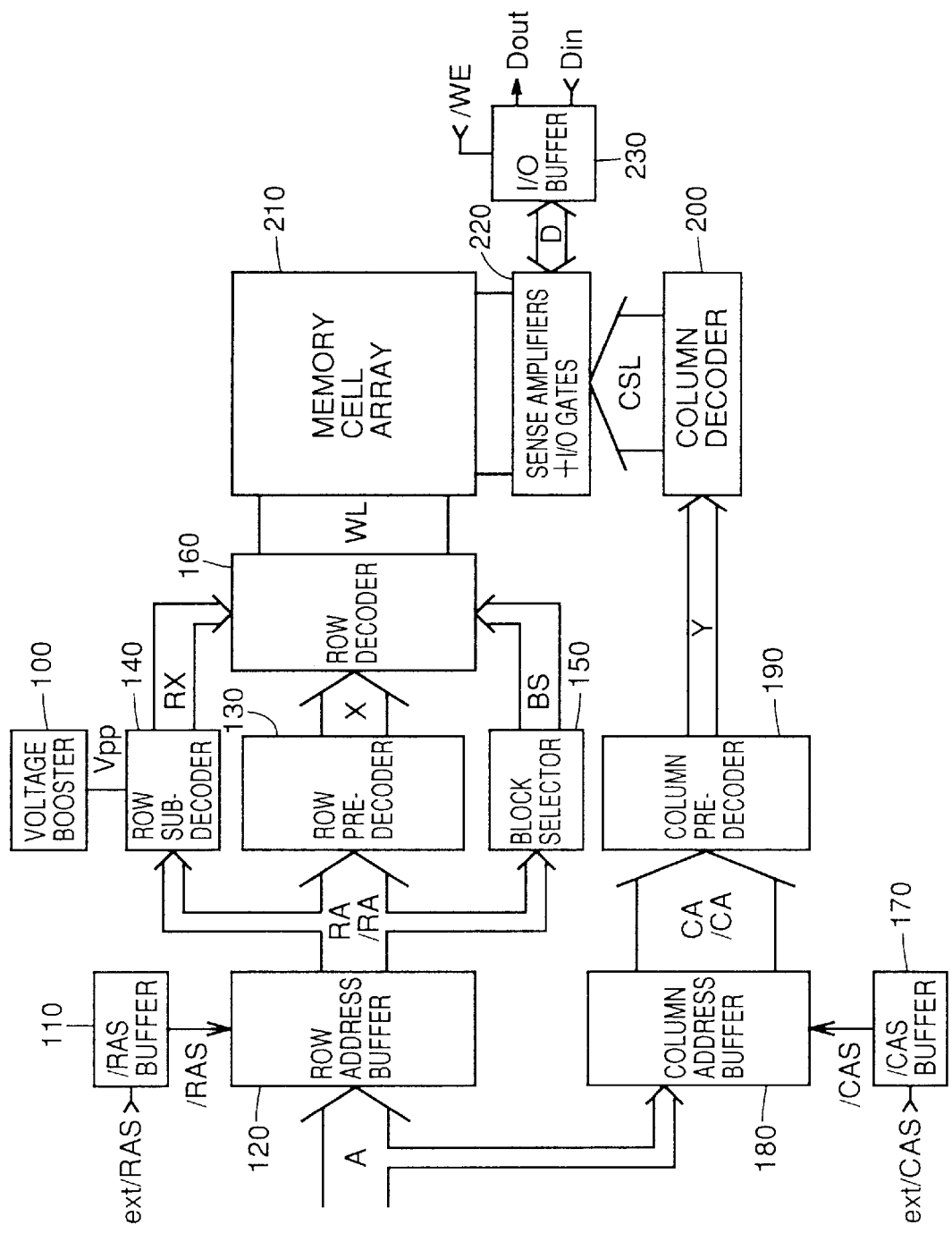
FIG. 1 is a block diagram of a DRAM chip based on an embodiment of this invention.

In FIG. 1 showing in block diagram the overall arrangement of the DRAM chip, a voltage booster circuit 100 which is supplied with a power voltage Vcc (e.g., 3.3 V) produces a voltage Vpp which is higher than the supply voltage Vcc.

A /RAS buffer 110 receives an external row address strobe signal ext/RAS and delivers an internal row address strobe signal /RAS. A row address buffer 120, which is connected to receive the internal row address strobe signal /RAS from the /RAS buffer 110 and an external address signal Ai, introduces the address signal Ai in response to a falling /RAS signal and delivers row address signals RAi and /RAi. A row pre-decoder 130 receives the row address signals RAi and /RAi from the row address buffer 120 and produce a corresponding pre-decode signal Xi. A row sub-decoder 140, which is supplied with the boosted voltage Vpp from the voltage booster circuit 100, receives part of the row address signals RAi and /RAi from the row address buffer 120 and produces a corresponding word line drive signal RXm. A block selection circuit 150 receives part of the row address signals RAi and /RAi from the row address buffer 120 and delivers a corresponding block select signal BSn. A row decoder 160 receives the pre-decode signal Xi from the row pre-decoder 130, the word line drive signal RXm from the row sub-decoder 140 and the block select signal BSn from the block selection circuit 150, and raises the signal WL of a word line selectively depending on these signals to the boosted voltage Vpp. A /CAS buffer 170 receives an external column address strobe signal ext/CAS and delivers an internal column address strobe signal /CAS. A column address buffer 180, which is connected to receive the internal column address strobe signal /CAS from the /CAS buffer 170 and the external address signal Ai, introduces the address signal Ai in response to a falling /CAS signal and delivers column address signals CAi and /CAi. A column pre-decoder 190 receives the column address signals CAi and /CAi from the column address buffer 180 and produce a corresponding pre-decode signal Yi. A column decoder 200 receives the pre-decode signal Yi from the column pre-decoder 190, and raises the signal CSL of a column select line selectively depending on the signal Yi to a high level (Vcc).

A memory cell array 210 includes a plurality of memory cells, word lines and bit line pairs. The memory cells are arranged on a matrix of rows and columns. Each word line corresponds to a row, and is connected to memory cells on the row. Each bit line pair corresponds to a column, and are connected to memory cells on the column. Indicated by 220 is a set of sense amplifiers and I/O gate circuits. Each sense amplifier is connected to a bit line pair to amplify a voltage difference between the bit lines of the line pair, and each I/O gate circuit operates to connect a bit line pair, which corresponds to the column select line activated by the column decoder 200, to an I/O line pair. An input/output buffer 230, which receives a write enable signal /WE, responds to a low /WE signal to conduct external data Din to the I/O line pair so that it is stored in a certain memory cell and responds to a high /WE signal to lead out data, which has been read out of a certain memory cell to the I/O line pair, as Dout to the outside.

Figure 2:
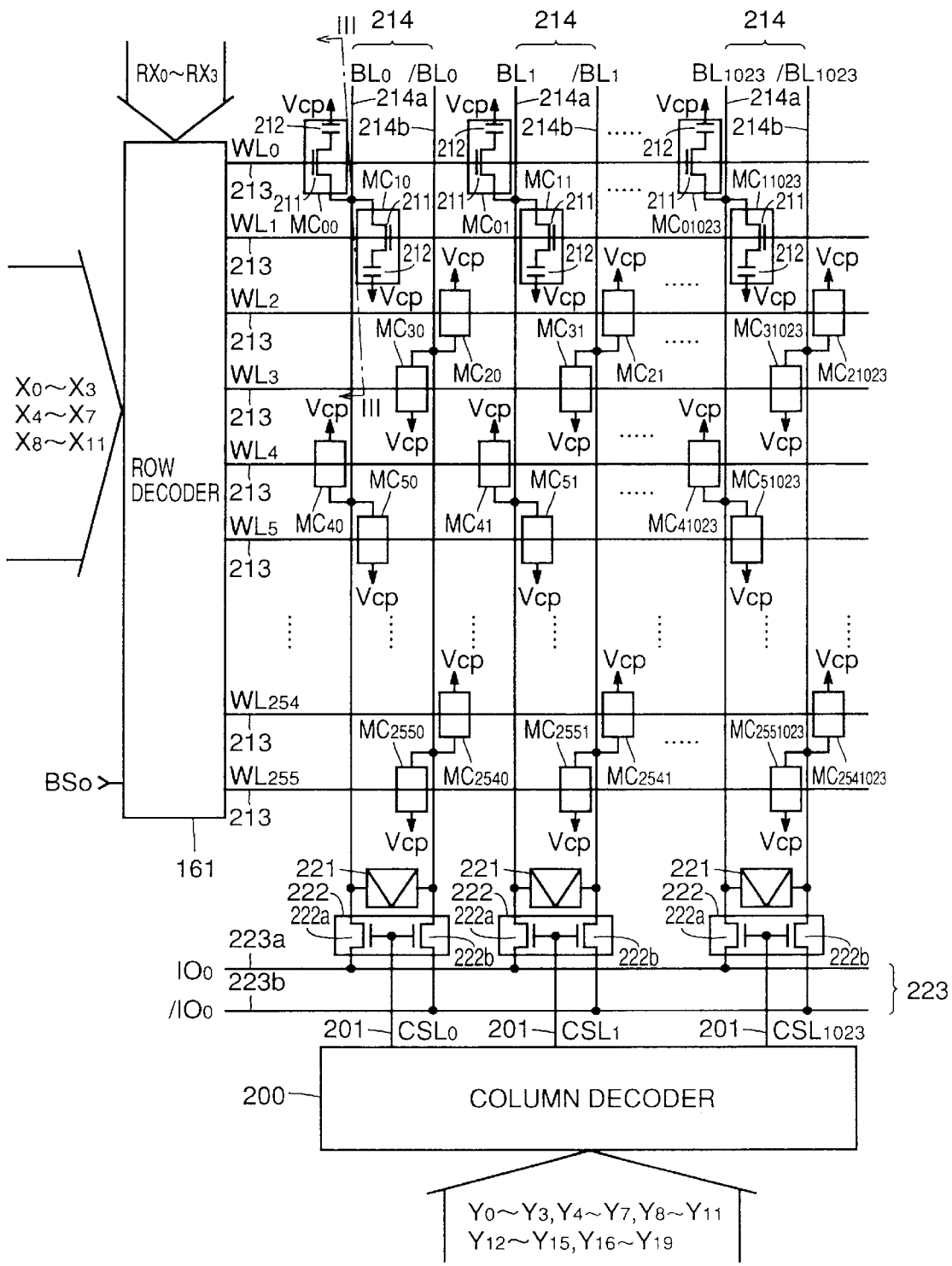
FIG. 2 is a schematic diagram showing part of the memory cell array of the DRAM chip of this embodiment.

FIG. 2 shows part of the memory cell array 210 and its associated circuits shown in FIG. 1. Shown in the figure is one block out of 16 blocks which constitute one memory mat out of four memory mats of the memory cell array 210. Each memory cell MCxy consists of an n-channel MOS transistor 211 and a capacitor 212, and is formed in correspondence to the intersection of a word line 213 and a bit line pair 214 of bit lines 214a and 214b. The MOS transistor 211 has its gate electrode formed as a part of the word line 213, and is connected between one electrode of the capacitor 212 and the bit line 214a or 214b. The capacitor 212 has another electrode supplied with a cell plate voltage Vcp which is an intermediate voltage derived from the supply voltage (i.e., Vcc/2).

A row decoder 161 for this block receives block select signal BS0 out of BS0–BS15 for the 16 blocks, and it raises a word line 213 out of 256 word lines selectively depending on three sets of row pre-decode signals X0–X3, X4–X7 and X8–X11 and word line drive signals RX0–RX3 to the boosted voltage Vpp. The row pre-decode signals X0–X3, X4–X7 and X8–X11 are such that when the block select signal BS0 is high (active), one of four signals of each set goes high (active) depending on the row address signal RAi. One of four word line drive signals RX0–RX3 becomes the boosted voltage Vpp (active) depending on the row address signal RAi.

The column decoder 200 which is common for 16 blocks turns high (activates) one of 1024 column select lines 201 in accordance with the column pre-decode signals Y0–Y3, Y4–Y7, Y8–Y11, Y12–Y15, and Y16–Y19. Each sense amplifier 221 is connected between bit lines 214a and 214b of a bit line pair 214, and it operates to amplify a voltage difference between the bit lines 214a and 214b. Each I/O gate circuit 222 has its gate terminal connected to a column select line to receive a column select signal CSLi, and is connected between a bit line pair 214 and the I/O line pair 223. The I/O gate circuit 222 provides conduction between the bit lines and I/O lines in response to a high column select signal CSLi. The I/O gate circuit 222 consists of an n-channel MOS transistor 222a connected between the bit line 214a and I/O line 223a and another n-channel MOS transistor 222b connected between the bit line 214b and I/O line 223b, with their common gate terminal being connected to the column select line 201.

Figure 3:
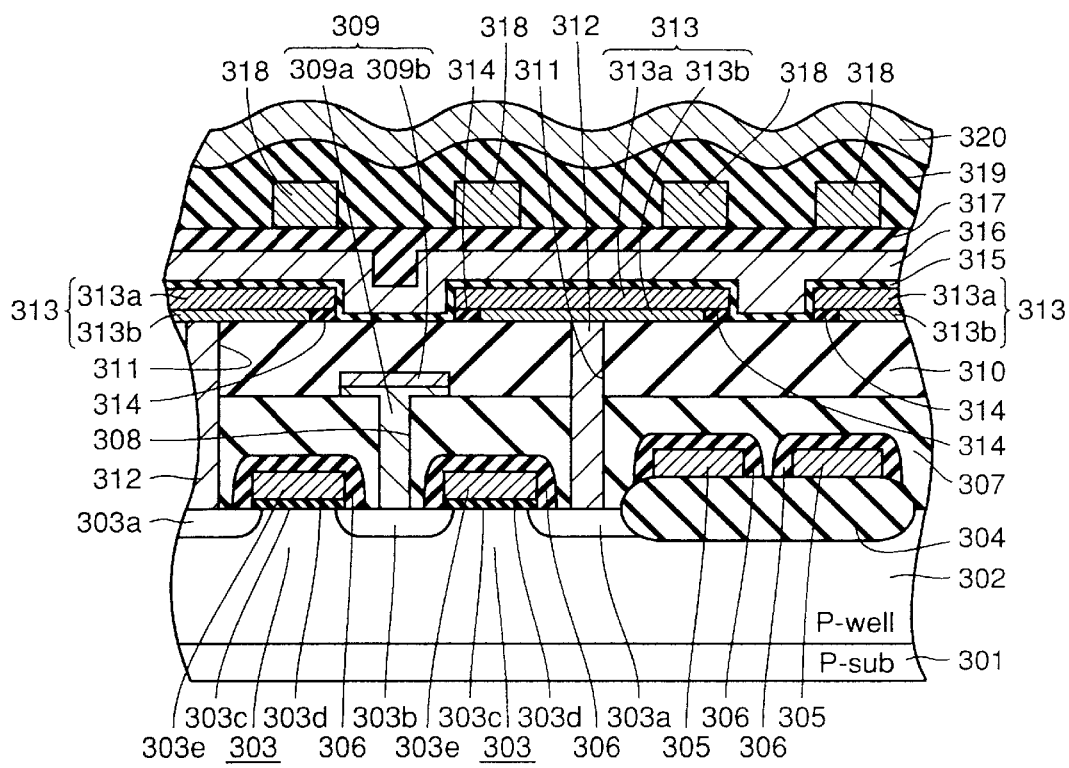
FIG. 3 is a partial cross-sectional view of the semiconductor substrate of DRAM chip, with memory cells being formed, taken along the line III—III of FIG. 2, FIG. 4A through FIG. 4G are partial cross-sectional views of the semiconductor substrate derived from FIG. 3, showing sequentially the steps of the fabricating process of the DRAM chip of this embodiment.

FIG. 3 is a cross-sectional view of the semiconductor substrate taken along the line III—III of FIG. 2, showing the formation of a memory cell MCxy and associated circuit. In the figure, on one major surface of a semiconductor substrate 301 of p-type silicon, there is formed a p-type well 302 having a higher impurity concentration than the substrate 301. There are shown two n-channel MOS transistors 303 formed in the well 302. The left-hand MOS transistor 303 is the MOS transistor 211 for memory cell MC00 in FIG. 2, and the right-hand MOS transistor 303 is the MOS transistor 211 for memory cell MC10. The n-channel MOS transistor 303 has one n+-type source/drain region 303a, another n+-type source/drain region 303b and a gate electrode 303e. Both source/drain regions 303a and 303b are formed in the well 302 by being spaced out from each other, and the gate electrode 303e is formed to confront a channel region 303c between the source/drain regions 303a and 303b with a gate insulation film 303d interposed therebetween. The two gate electrodes 303e are part of the word lines 213 of word signals WL0 and WL1 running in parallel.

A device separation region 304 is formed of a silicon oxide film. Similarly, word lines 305 partly serve as gate electrodes of n-channel MOS transistors 211 for memory cells MC20 and MC30 (not shown in FIG. 3), and these lines are word lines 213 of word signals WL2 and WL3 in FIG. 2. Oxide films 306 are formed to cover the gate electrodes 303e and word lines 305. An inter-layer insulation film 307 of BPSG (Boro-Phospho Silicate Glass) having a planar upper surface is formed on the entire semiconductor substrate 301. A contact hole 308 is formed to run through the inter-layer insulation film 307 and reach the upper surface of the source/drain region 303b. A bit line 309 is formed on the inter-layer insulation film 307, and it is connected through the contact hole 308 to the source/drain region 303b of the MOS transistors 303. The bit line 309 consists of a connecting section 309a of n-type poly-Si in connection with the source/drain region 303b and a low-resistance section 309b of aluminum (Al) which is provided for lowering the resistance of the bit line 309.

An inter-layer insulation film 310 of BPSG film is formed on the entire surface of the inter-layer insulation film 307. A contact hole 311 is formed to run through the inter-layer insulation films 310 and 307 and reach the source/drain region 303a of the MOS transistor 303. A plug 312 of n-type poly-Si is formed in the interior of the contact hole 311 and connected to the source/drain region 303a. One capacitor electrode 313 is formed on the inter-layer insulation film 310, and it is connected through the plug 312 to the source/drain region 303a of the MOS transistor 303. The capacitor electrode 313 consists of a high-layer electrode 313a and a low-layer electrode 313b. The high-layer electrode 313a is formed of platinum (Pt), tantalum (Ta), rubidium (Ru) or metallic oxide thereof. The low-layer electrode 313b, which is made from a TiN, Ta, Ti or $RuO_2$ layer, or $Ti/TiO_2$ or Ti/TiN/Ti layers for functioning as a barrier, is formed by being in contact with the lower surface the high-layer electrode 313a, and it has a circumferential side surface located inner than the side surface of the high-layer electrode 313a.

An insulator 314 of silicon oxide or silicon nitride is formed beneath the high-layer electrode 313a by being in contact with the side surface of the low-layer electrode 313b. A capacitor dielectric film 315 is formed by being in contact with the upper surface and side surface of the high-layer electrode 313a and to confront the side surface of the low-layer electrode 313b with the insulator 314 interposed therebetween. The capacitor dielectric film 315 is made from strontium titanate ($SrTiO_3$), barium titanate ($BaTiO_3$), barium/strontium titanate (($Ba,Sr)TiO_3$), lead zirconite titanate (PZT), or lead lanthaneum zirconate titanate (PLZT). Another capacitor electrode 316 of Pt, Ta, Ru or metallic oxide thereof is formed to confront the one capacitor electrode 313 with the capacitor dielectric film 315 interposed therebetween. The capacitor electrodes 313 and 316 and the capacitor dielectric film 315 in unison constitute a capacitor. The high-layer electrode 313a of the one capacitor electrode 313 is made from Pt, Ta, Ru or metallic oxide thereof so that the dielectric film 315 has a normal crystal structure of high-dielectric material.

An inter-layer insulation film 317 of BPSG having a planar upper surface is formed on the entire surface of the other capacitor electrode 316. Wiring strips 318 are formed on the inter-layer insulation film 317 by being located in parallel to word lines which partly serve as the gate electrodes 303e. Each wiring strip 318 made from aluminum (Al) is connected at the shunt region to a word line running below it for every 128 bit line pair. An inter-layer insulation film 319 of silicon oxide is formed to cover the wiring strips 318. Other wiring strips 320 of aluminum used for the Vcc power lines and ground lines are formed on the inter-layer insulation film 319 by being arranged perpendicularly to the wiring strips 318.

Next, the data read operation of the DRAM chip arranged as described above will be explained. When the external row address strobe signal ext/RAS is turned from high to low (activated), with an address signal Ai being placed on the address port, the internal row address strobe signal /RAS from the /RAS buffer 110 goes low, causing the row address buffer 120 to introduce the address signal Ai as a row address. From the address signal Ai, the row address buffer 120 produces and delivers a row address signal RAi and inverted row address signal /RAi. The row pre-decoder 130 turns high one of four signals in each of three sets of pre-decode signals X0–X3, X4–X7 and X8–X11 depending on the row address signals RAi and /RAi.

The row sub-decoder 140 raises one of the word line drive signals RX0–RX3 depending on the row address bit pairs RA0, /RA0, RA1 and /RA1 to the boosted voltage Vpp. The block selection circuit 150 turns high one of 16 block select signals BS0–BS15 depending on the row address signals RAi and /RAi. A row decoder 161 for the block provided with a high block select signal BSj among the row decoder set 160 raises a voltage WLk of a word line 213 to the boosted voltage Vpp.

This voltage signal causes the n-channel MOS transistor 211 of the memory cell MCky in connection with this word line 213 to become conductive, and it connects one electrode of the associated capacitor 212 to the bit line 214a (or 214b) precharged at the intermediate voltage Vcc/2.

In this case, if the supply voltage Vcc is being held on the electrode of the capacitor 212, a current flows from the capacitor 212 to the bit line 214a (or 214b), causing the bit line to have its voltage BLy (or /BLy) falling slightly from the intermediate voltage Vcc/2. Otherwise, if the ground voltage is being held on the capacitor electrode, a current flows from the bit line 214a (or 214b) to the capacitor, causing the bit line voltage BLy (or /BLy) to rise slightly from the intermediate voltage Vcc/2. A resulting small voltage difference between the bit line pair is amplified by the sense amplifier 211, which then pulls the higher-voltage bit line to the supply voltage Vcc and the lower-voltage bit line to the ground voltage.

After that, when the external column address strobe signal ext/CAS is turned from high to low (activated), with an address signal Ai for the column address being placed on the address port, the internal column address strobe signal /CAS from the /CAS buffer 170 goes low, causing the column address buffer 180 to introduce the address signal Ai as a column address. From the address signal Ai, the column address buffer 180 produces and delivers a column address signal CAi and inverted column address signal /CAi. The column pre-decoder 190 turns high one of four signals in each of five sets of pre-decode signals Y0–Y3, Y4–Y7, Y8–Y11, Y12–Y15 and Y16–Y19 depending on the column address signals CAi and /CAi.

The column decoder 200 turns high one column select line 201 depending on the pre-decode signals Y0–Y3, Y4–Y7, Y8–Y11, Y12–Y15 and Y16–Y19. This high-level signal causes the n-channel MOS transistors 222a and 222b of the I/O gate circuit 222 in connection with that column select line 201 to become conductive and connect the associated bit line pair 214 to the I/O line pair 223. Consequently, complementary data IOn and /IOn which represent the bit data which has been stored in the selected memory cell MCkp are led out to the input/output buffer 230. The input/output buffer 230 delivers the bit data in the output data Dout.

The data write operation of the DRAM chip is as follows. The write enable signal /WE is turned low, with input data Din being placed on the data port, before the external column address strobe signal ext/CAS is turned low. Consequently, the I/O lines 223a and 223b take a high and low levels, or vice versa. The column decoder 200 activates a bit line pair 214 in accordance with the column address signals CAi and /CAi, in the same manner as read operation, so that a low (or high) level signal on the I/O line pair 223 is conducted to the capacitor of the selected memory cell MCkp.

Finally, the external column address strobe signal ext/CAS and external row address strobe signal ext/RAS are turned high, causing all I/O gate circuits 222 to become non-conductive. All word lines 213 are turned low, and the data read operation or write operation of the DRAM chip completes.

Next, the fabrication process of the DRAM chip shown in FIG. 3 for its unit section will be explained with reference to FIG. 4A through FIG. 4G.

Figure 4A:
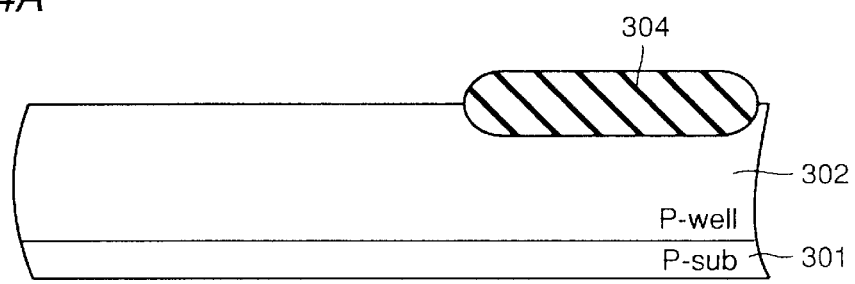

In FIG. 4A, on one major surface of a p-type semiconductor substrate 301, a p-type well 302 having a higher impurity concentration than the substrate 301 is formed based on the injection of p-type ion such as boron ion. A device separation region 304 is formed at the specified position of the major surface of the substrate 301 based on the LOCOS (Local Oxidation of Silicon) process.

Figure 4B:
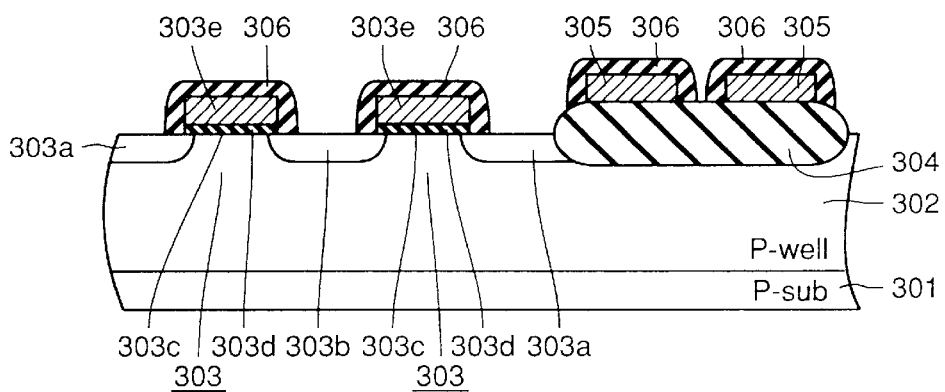

Next, in FIG. 4B, an oxide film used for the gate insulation film is formed in the area where MOS transistors 303 will be formed based on the thermal oxidation process. An electrode layer of conductive material, such as poly-Si doped with n-type impurity ion, which will become the gate electrodes of the MOS transistors 303 is deposited on the oxide film based on the CVD (Chemical Vapor Deposition) process. The electrode layer is formed into gate electrodes 303e and word lines 305 based on the photolithographic process and etching process. The oxide film is partially etched off by using the gate electrodes 303e as a mask, resulting in the formation of gate insulation films 303d beneath the gate electrodes 303e.

N-type ion such as arsenic ion is injected and diffused from above the substrate by using the gate electrodes 303e as a mask, and source/drain regions 303a and 303b are formed. A silicon oxide film 306 is formed to cover the gate electrodes 303e and word lines 305 based on the CVD process or the like.

Figure 4C:
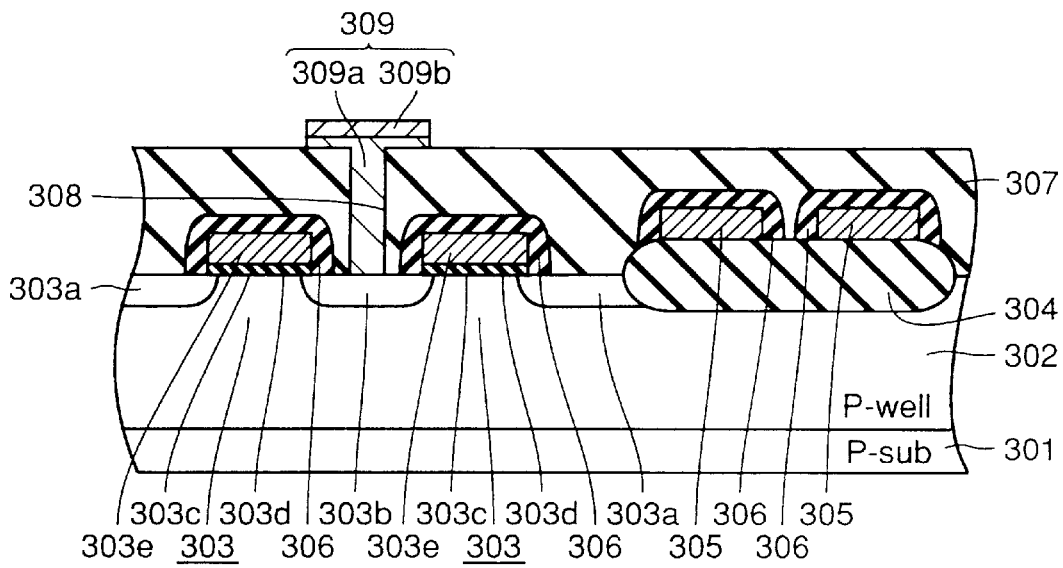

Next, in FIG. 4C, an inter-layer insulation film 307 of BPSG is formed on the entire surface based on the CVD process. A contact hole 308 is formed to run through the inter-layer insulation film 307 and reach the upper surface of the source/drain region 303b based on the photolithographic process and etching process. A layer of n-type poly-Si is formed on the inter-layer insulation film 307 and in the contact hole 308 based on the CVD process. An aluminum film is formed on the poly-Si film based on the CVD process or sputtering process. These films are patterned to form a bit line 309, which is made up of a connecting section 309a and low-resistance section 309b, based on the photolithographic process and etching process.

Figure 4D:
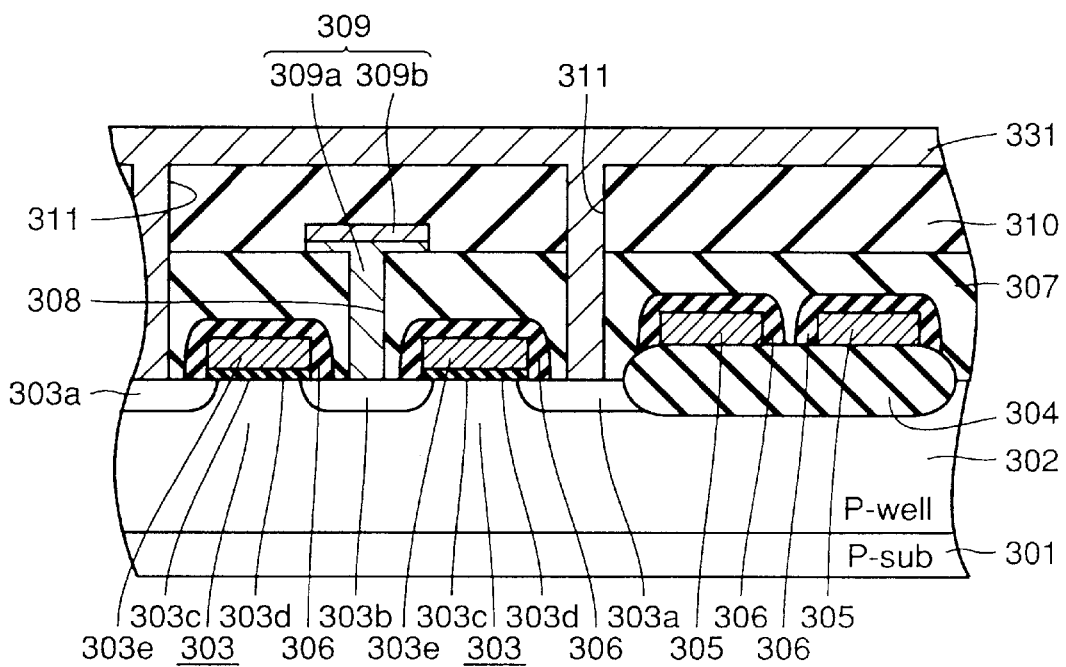

Next, in FIG. 4D, an inter-layer insulation film 310 of BPSG is formed on the entire surface based on the CVD process, and its upper surface is made coplanar. A contact hole 311 is formed to run through the inter-layer insulation films 310 and 307 and reach the upper surface of the source/drain region 303a based on the photolithographic process and etching process. A layer of n-type poly-Si 331 is formed on the inter-layer insulation film 310 and in the contact hole 311 based on the CVD process.

Figure 4E:
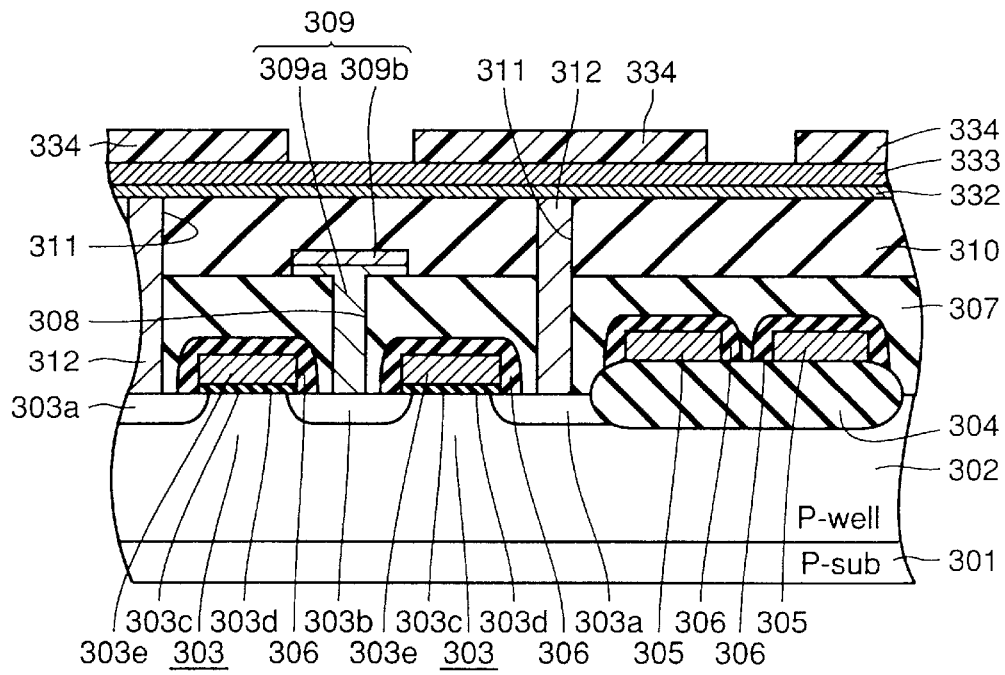

Next, in FIG. 4E, the n-type poly-Si layer 331 is etched off down to the upper surface of the inter-layer insulation film 310 so that a plug 312 is formed in the contact hole 311. On the entire surface of the inter-layer insulation film 310, a barrier layer 332 which will become a low-layer electrode 313b is formed of a TiN, Ta, Ti or $RuO_2$ layer or $Ti/TiO_2$ or Ti/TiN/Ti layers based on the CVD process or sputtering process. On the entire surface of the barrier layer 332, a layer of high fusion point noble metal 333 which will become a high-layer electrode 313a is formed of Pt, Ta, Ru or metallic oxide thereof based on the sputtering process or the like. The noble metal layer 333 is patterned to form a resist 334 based on the photolithographic process.

Figure 4F:
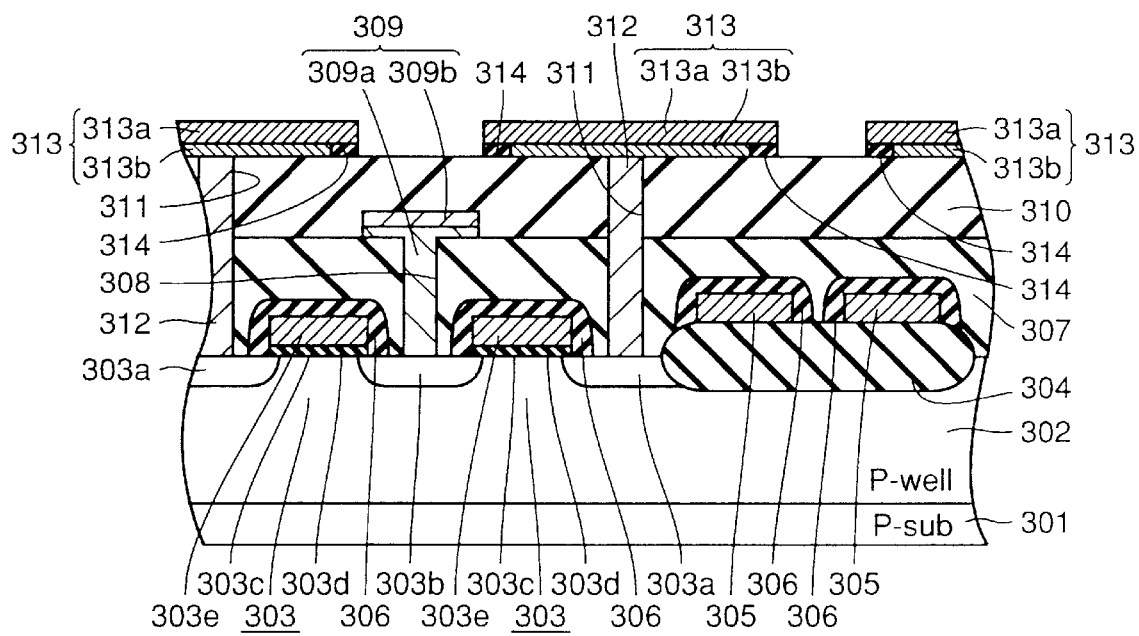

Next, in FIG. 4F, the noble metal layer 333 and barrier layer 332 are etched off by using the resist 334 as a mask. Consequently, the high-layer electrode 313a and low-layer electrode 313b are completed, and the resist 334 is removed. Based on the selective etching process, the low-layer electrode 313b is trimmed to have its edge located inner than the edge of the high-layer electrode 313a. A silicon oxide film or silicon nitride film is formed on the entire surface based on the CVD process, and then etched off so that an insulator 314 is formed beneath the high-layer electrode 313a in contact with the side surface of the low-layer electrode 313b.

Figure 4G:
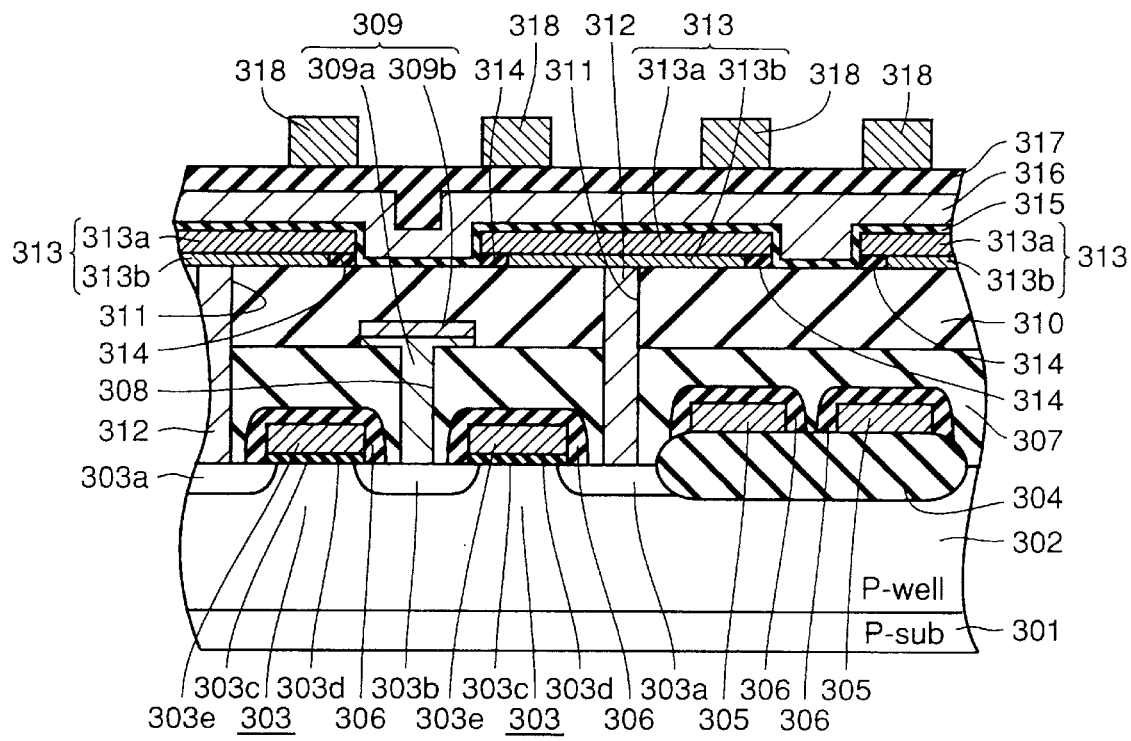
Figure 5:
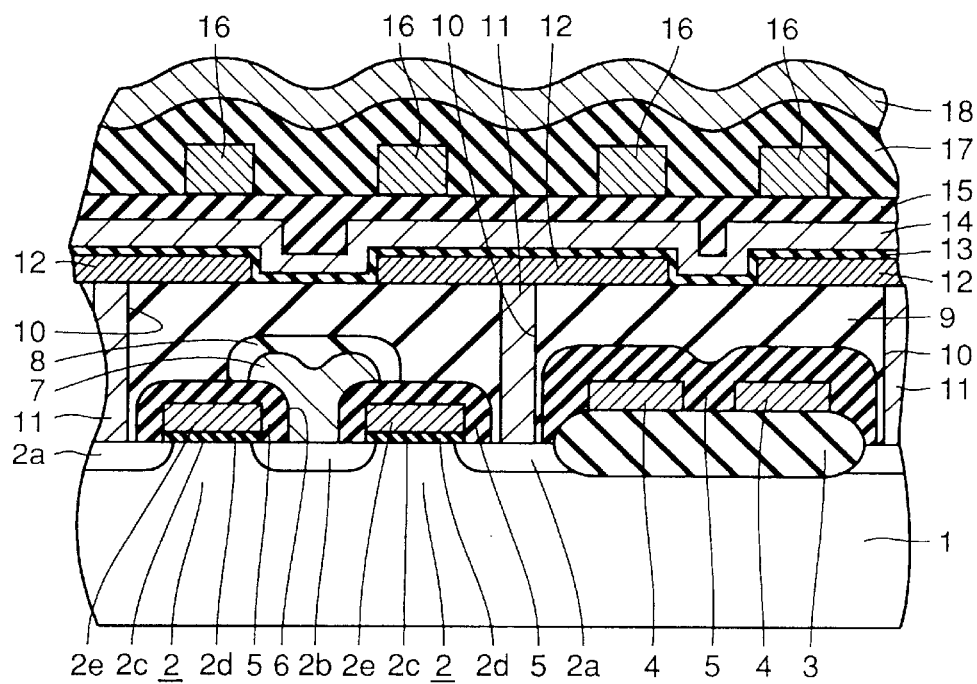
FIG. 5 is a partial cross-sectional view of the conventional semiconductor substrate of DRAM chip, with memory cells being formed.
Figure 6:
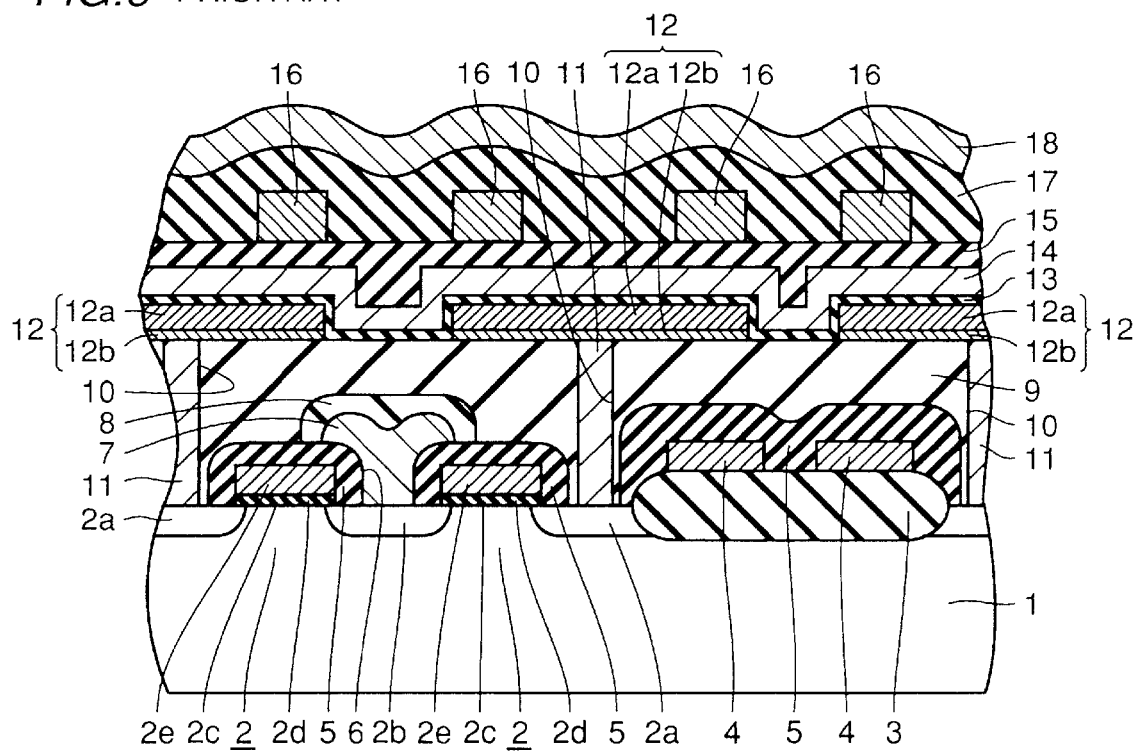
FIG. 6 is a partial cross-sectional view of the improved conventional semiconductor substrate of DRAM chip, with memory cells being formed.

Next, in FIG. 4G, a capacitor dielectric film 315 is formed of $SrTiO_3$, $BaTiO_3$] $(Ba,Sr)TiO_3$] PZT or PLZT on the entire surface based on the CVD process. On the dielectric film 315, a layer of high fusion point noble metal of Pt, Ta, Ru or metallic oxide thereof is formed based on the sputtering process or the like. The noble metal layer is patterned to form the other capacitor electrode 316 based on the photolithographic process and etching process.

A film of BPSG is formed on the entire surface based on the CVD process, and its upper surface is made coplanar to complete an inter-layer insulation film 317. On the inter-layer insulation film 317, a layer of aluminum is formed based on the sputtering process or the like. The aluminum layer is patterned to form wiring strips 318 based on the photolithographic process and etching process.

After that, an inter-layer insulation film 319 of silicon oxide is formed on the entire surface based on the CVD process, as shown in FIG. 3. On the insulation film 319, a layer of aluminum is formed based on the sputtering process or the like. Finally, the aluminum layer is patterned to form wiring strips 320 based on the photolithographic process and etching process.

As described above, the DRAM chip based on this embodiment uses a high-dielectric film of polycrystal structure for the capacitor dielectric film 315, enabling the capacitors with a smaller electrode area to have a larger capacitance. Consequently the memory cells have a longer data holding time.

The low-layer electrode 313b which functions as a barrier is placed between the high-layer electrode 313a provided for the normal crystal structure of the capacitor dielectric film 315 and the inter-layer insulation film 310 and plug 312. This structure suppresses the occurrence of the reduction of dielectric constant or the deterioration of insulation of the capacitor dielectric film 315 caused by its abnormal crystal structure due to the diffusion of silicon atoms from the inter-layer insulation film 310 or plug 312 to the high-layer electrode 313a.

The low-layer electrode 313b has its edge located inner than the edge of the high-layer electrode 313a, and it is spaced out at its edge from the capacitor dielectric film 315 by being interposed with the insulator 314. Consequently, even if the portion of capacitor dielectric film 315 confronting the side surface of the low-layer electrode 313b has varied in crystal structure to result in having deteriorated insulation characteristics, it is possible to suppress the leakage current flowing between the edge of the low-layer electrode 313b and the other capacitor electrode 316 through that portion.

Consequently, the inventive semiconductor device has memory cells with superior data holding characteristics based on the suppression of the leakage current of the capacitors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device incorporating capacitors comprising:
    a first capacitor electrode;
    a capacitor dielectric film; and
    a second capacitor electrode confronting said first capacitor electrode with said capacitor dielectric film interposed therebetween,
    said first capacitor electrode including a first layer which has upper and lower surfaces and a circumferential side surface, and a second layer having an upper surface in electrical contact with a major portion of the lower surface of said first layer and has a circumferential side surface located inwardly of the circumferential side surface of said first layer, said second layer being formed of a barrier material and having an electrical conductor extending downwardly from a lower surface thereof,
    said capacitor dielectric film being in contact with the upper surface and circumferential side surface of said first layer, spaced apart from the circumferential side surface of said second layer, and in confronting relation therewith.

2. A semiconductor device according to claim 1, wherein said capacitor dielectric film includes a material which has a polycrystal structure when formed in contact with said first layer and has a structure different from said polycrystal structure when formed in contact with said second layer.

3. A semiconductor device according to claim 1, wherein said capacitor dielectric film is spaced apart from the circumferential side surface of said second layer by an insulator.

4. A semiconductor device according to claim 1, wherein said capacitor dielectric film includes at least one material selected from the group consisting of $SrTiO_3$, $BaTiO_3$, $(Ba,Sr)TiO_3$, PZT, and PLZT.

5. A semiconductor device according to claim 1, wherein said first layer includes at least one material selected from the group consisting of Pt, Ta, Ru, and metallic compounds thereof.

6. A semiconductor device according to claim 1, wherein said second layer includes at least one material selected from the group consisting of TiN, Ta, Ti, and RuO2.

7. A semiconductor device according to claim 1, wherein said second capacitor electrode includes at least one material selected from the group consisting of Pt, Ta, Ru, and metallic compounds thereof.

8. A semiconductor device incorporating capacitors comprising:
    a first capacitor electrode;
    a capacitor dielectric film including at least one material selected from the group consisting of SrTiO3, BaTiO3, (Ba,Sr)TiO3, PZT, and PLZT; and
    a second capacitor electrode confronting said first capacitor electrode with said capacitor dielectric film interposed therebetween,
    said first capacitor electrode including a first layer which has upper and lower surfaces and a circumferential side surface and includes at least one material selected from the group consisting of Pt, Ta, Ru, and metallic compounds thereof, and a second layer having an upper surface in electrical contact with a major portion of the lower surface of said first layer, has a circumferential side surface located inwardly of the circumferential side surface of said first layer, includes at least one barrier material selected from the group consisting of TiN, Ta, Ti, and RuO2, and has an electrical conductor extending downwardly from a lower surface thereof,
    said capacitor dielectric film being in contact with the upper surface and circumferential side surface of said first layer, spaced apart from the circumferential side surface of said second layer, and in confronting relation therewith.

9. A semiconductor device according to claim 8, wherein said second capacitor electrode includes at least one material selected from the group consisting of Pt, Ta, Ru, and metallic compounds thereof.

10. A semiconductor device according to claim 8, wherein said capacitor dielectric film is spaced apart from the circumferential side surface of said second layer by an insulator.

11. A semiconductor device comprising:
    a semiconductor substrate having a major surface and including a region of a first conductivity type; and
    field effect transistors formed on the major surface of said substrate, each of said transistors including a first impurity region of a second conductivity type formed on the major surface of said substrate, a second impurity region of the second conductivity type formed on the major surface of said substrate spaced apart from said first impurity region, and a gate electrode formed to confront a region between said first and second impurity regions on the major surface of said substrate with a gate insulation film interposed therebetween;
    an inter-layer insulation film formed on the major surface of said substrate and has a contact hole which reaches the surface of said first impurity region; and
    capacitors formed on said inter-layer insulation film, each of said capacitors including a first capacitor electrode, a capacitor dielectric film and a second capacitor electrode formed to confront said first capacitor electrode with said capacitor dielectric film interposed therebetween, said first capacitor electrode including a first layer having upper and lower surfaces and a circumferential side surface, and a second layer in electrical contact with a major portion of the lower surface of said first layer has a circumferential side surface located inwardly of the circumferential side surface of said first layer, said second layer being formed of a barrier material, and having an electrical conductor extending downwardly from a lower surface thereof, said capacitor dielectric film being in contact with the upper surface and circumferential side surface of said first layer, spaced apart from the circumferential side surface of said second layer, and in confronting relation therewith, said transistors and said capacitors together constituting memory cells.

12. A semiconductor device according to claim 11, wherein said capacitor dielectric film includes a material which has a polycrystal structure when formed in contact with said first layer and has a structure different from said polycrystal structure when formed in contact with said second layer.

13. A semiconductor device according to claim 11, wherein said capacitor dielectric film is spaced apart from the circumferential side surface of said second layer by an insulator.

14. A semiconductor device according to claim 11, wherein said capacitor dielectric film includes at least one material selected from the group consisting of $SrTiO_3$, $BaTiO_3$, $(Ba,Sr)TiO_3$, PZT, and PLZT.

15. A semiconductor device according to claim 11, wherein said first layer includes at least one material selected from the group consisting of Pt, Ta, Ru, and metallic compounds thereof.

16. A semiconductor device according to claim 11, wherein said second layer includes at least one material selected from a group of TiN, Ta, Ti, and $RuO_2$.

17. A semiconductor device according to claim 11, wherein said second capacitor electrode,,includes at least one material selected from the group consisting of Pt, Ta, Ru, and metallic compounds thereof.

18. A semiconductor device comprising:

a semiconductor substrate having a major surface and including a region of a first conductivity type; and field effect transistors formed on the major surface of said substrate, each of said transistors including a first impurity region of a second conductivity type formed on the major surface of said substrate, a second impurity region of the second conductivity type formed on the major surface of said substrate spaced apart from said first impurity region, and a gate electrode formed to confront a region between said first and second impurity regions on the major surface of said substrate with a gate insulation film interposed therebetween;

an inter-layer insulation film which is formed on the major surface of said substrate and has a contact hole which reaches the surface of said first impurity region; and capacitors formed on said inter-layer insulation film, each of said capacitors including a first capacitor electrode, a capacitor dielectric film including at least one material selected from the group consisting of SrTiO3, BaTiO3, (Ba,Sr)TiO3, PZT, and PLZT, and a second capacitor electrode formed to confront said first capacitor electrode with said capacitor dielectric film interposed therebetween, said first capacitor electrode including a first layer having upper and lower surfaces and a circumferential side surface and including at least one material selected from the group consisting of Pt, Ta, Ru, and metallic compounds thereof, and a second layer in electrical contact with a major portion of the lower surface of said first layer, has a circumferential side surface located inwardly of the circumferential side surface of said first layer, includes at least one barrier material selected from the group consisting of TiN, Ta, Ti, and RuO2, and has an electrical conductor extending downwardly from a lower surface thereof, said capacitor dielectric film being in contact with the upper surface and circumferential side surface of said first layer, spaced apart from the circumferential side surface of said, and in confronting relation therewith, said transistors and said capacitors together constituting memory cells.

\* \* \* \* \*